United States Patent [19]
Saito et al.

[11] Patent Number: 6,078,127
[45] Date of Patent: Jun. 20, 2000

[54] STACKED PIEZOELECTRIC TRANSFORMER AND METHOD OF MANUFACTURING THE SAME

[75] Inventors: Susumu Saito; Takayuki Inoi, both of Tokyo, Japan

[73] Assignee: NEC Corporation, Tokyo, Japan

[21] Appl. No.: 09/211,000

[22] Filed: Dec. 15, 1998

[30] Foreign Application Priority Data

Dec. 17, 1997 [JP] Japan ................................. 9-348044

[51] Int. Cl.$^7$ .................................................. H01L 41/08
[52] U.S. Cl. ........................... 310/363; 310/359; 310/366
[58] Field of Search .................................. 310/358, 359, 310/363, 366

[56] References Cited

U.S. PATENT DOCUMENTS

| 5,196,757 | 3/1993 | Omatsu | 310/358 |
| 5,841,216 | 11/1998 | Fransen et al. | 310/328 |
| 5,892,318 | 4/1999 | Dai et al. | 310/358 |

FOREIGN PATENT DOCUMENTS

| 58-196069 | 11/1983 | Japan | 310/363 |
| 0159777 | 7/1986 | Japan | 310/363 |
| 0216368 | 9/1986 | Japan | 310/363 |
| 8-107241 | 4/1996 | Japan | . |
| 8-306984 | 11/1996 | Japan | . |

*Primary Examiner*—Mark O. Budd
*Attorney, Agent, or Firm*—Sughrue, Mion, Zinn, Macpeak & Seas, PLLC

[57] ABSTRACT

A stacked piezoelectric transformer is formed by stacking piezoelectric ceramic sheets each formed with internal electrodes at their predetermined regions, and has portions formed with the internal electrodes as input portions, and a portion not formed with the internal electrodes as an output portion. Ceramic layers, which are formed by mixing a small amount of metal powder to a ceramic powder made of the same material as that of the piezoelectric ceramic sheets, are formed among layers of the output portion. A method of manufacturing a stacked piezoelectric transformer includes the steps of forming an internal electrode at a predetermined region of a piezoelectric ceramic sheet, forming a ceramic material at the remaining region of the piezoelectric ceramic sheet, and stacking a plurality of piezoelectric ceramic sheets each obtained in this manner. The ceramic material is obtained by mixing a small amount of metal powder to a ceramic powder made of the same material as that of the piezoelectric ceramic sheet, and is formed to have the same thickness as that of the internal electrode.

4 Claims, 4 Drawing Sheets

STACKED PIEZOELECTRIC TRANSFORMER AND METHOD OF MANUFACTURING THE SAME

BACKGROUND OF THE INVENTION

1. FIELD OF THE INVENTION

The present invention relates to a piezoelectric transformer used in a backlight inverter for a liquid crystal display, an inverter for lighting a fluorescent tube, a high-voltage power supply circuit for a copying machine, and the like and, more particularly, to a compact, low-profile piezoelectric transformer of which down sizing and high reliability are required and which generates a high voltage, and a method of manufacturing the same.

2. DESCRIPTION OF THE PRIOR ART

Conventionally, in a backlight inverter for a liquid crystal display, an inverter for lighting a fluorescent tube, a high-voltage power supply circuit for a copying machine, and the like, a winding electromagnetic transformer is used as a high-voltage generating element. A piezoelectric transformer has attracted attention due to requirements such as reduction in the generated electromagnetic noise, power consumption, height, and the like.

FIG. 1A shows a conventional symmetric Rosen tertiary stacked piezoelectric transformer. The symmetric Rosen tertiary stacked piezoelectric transformer shown in FIG. 1A is constituted by a rectangular piezoelectric element 1 having electrodes formed on its surface. Regions 101 of the piezoelectric element 1 serve as the input portions of the piezoelectric transformer. Planar input electrodes 2a, 2b, 2c, and 2d are formed on the upper and lower surfaces of the input portions 101. These input portions 101 are polarized in the direction of thickness of the piezoelectric element 1. Side electrodes 3a, 3b, 3c, and 3d electrically connect the input electrodes 2a, 2b, 2c, and 2d to internal electrodes.

A region 102 of the piezoelectric element 1 which is sandwiched by the regions 101 forms the output portion of the piezoelectric transformer. Planar output electrodes 4a and 4b are formed on the upper and lower surfaces of the region 102. This output portion is polarized in the direction of length of the piezoelectric element 1.

The piezoelectric transformer shown in FIG. 1A operates in the following manner. When a voltage is applied from external terminals 5a and 5b to the input electrodes 2a, 2b, 2c, and 2d of the input portions 101, an electric field is applied to the input portions 101 in the direction of polarization. Longitudinal vibration in the direction of length of the piezoelectric element 1 is excited by the inverse piezoelectric effect in which the element is displaced in a direction perpendicular to the direction of polarization, and the entire piezoelectric element vibrates.

In the output portion 102, mechanical strain occurs in the direction of polarization of the piezoelectric element 1. Then, due to the piezoelectric positive effect in which a potential difference occurs in the direction of polarization, a voltage having the same frequency as that of the input voltage is output from the output electrodes 4a and 4b to external terminals 6a and 6b.

In the piezoelectric transformer, the output voltage is proportional to the ratio of the static capacitance of the input portions 101 to that of the output portion 102. Accordingly, a stacked piezoelectric transformer is becoming the mainstream.

A stacked piezoelectric transformer uses platinum, palladium, a silver-palladium alloy, or the like as the material of the internal electrodes, and is formed by stacking a predetermined number of internal electrode-forming piezoelectric ceramic sheets 7, as shown in FIG. 1B. The internal electrode material has an effect of promoting sintering reaction of the ceramic material. Thus, in the stacked piezoelectric transformer, the grain size of the ceramic crystal after sintering differs between the input portions where the input electrodes are present, and the output portion where the input electrodes are not present. As a result, some portions of the obtained piezoelectric transformer element are not sufficiently sintered, and a high mechanical strength and good electrical characteristics cannot be obtained.

A stacked piezoelectric transformer in which these problems are solved is disclosed in, e.g., Japanese Unexamined Patent Publication No. 8-306984. FIGS. 2A to 2C show a stacked piezoelectric transformer shown in Japanese Unexamined Patent Publication No. 8-306984, in which FIG. 2A is a perspective view, FIG. 2B is a plan view showing piezoelectric ceramic sheets formed with internal electrodes, and FIG. 2C is a sectional view of the element. Referring to FIGS. 2A to 2C, reference numeral 27 denotes a piezoelectric ceramic sheet formed with an internal electrode 28; 21, a piezoelectric ceramic rectangular plate; 22, an input electrode, 24, an output electrode, and 29, a floating internal electrode for controlling the reactivity of the ceramic crystal grain.

In the stacked piezoelectric transformer, a step formed due to the presence/absence of internal electrodes leads to cracking or separation. A stacked piezoelectric transformer in which this problem is solved is disclosed in, e.g., Japanese Unexamined Patent Publication No. 8-107241. FIG. 3 is a perspective view showing piezoelectric ceramic sheets used in the piezoelectric transformer element disclosed in Japanese Unexamined Patent Publication No. 8-107241 and formed with internal electrodes. Referring to FIG. 3, reference numeral 34 denotes an output electrode; 37, a piezoelectric ceramic sheet; 38, an internal electrode; and 39, a spacer for correcting the thickness of the internal electrode.

In a structure having the floating internal electrodes 29 formed in the output portion of the piezoelectric transformer like the stacked piezoelectric transformer of Japanese Unexamined Patent Publication No. 8-306984 shown in FIGS. 2A to 2C, although the reactivity of the ceramic crystal grains can be controlled, separation or void occurs near the floating internal electrodes while sintering the floating internal electrodes 29. Due to these separation and void, the electrical characteristics are degraded, and the effect of controlling the reactivity of the ceramic crystal grains cannot be easily obtained.

In a structure merely having the ceramic spacers 39 formed at portions excluding the internal electrodes like the stacked piezoelectric transformer of Japanese Unexamined Patent Publication No. 8-107241 shown in FIG. 3, the ceramic crystal grains at the output portion cannot be grown. In this case, although separation can be avoided, the electrical characteristics cannot be improved.

SUMMARY OF THE INVENTION

The present invention has been made in consideration of the above situation in the prior art, and has as its object to provide a piezoelectric transformer in which the reactivity of ceramic crystal grains during sintering is controlled without producing internal defects and accordingly the ceramic crystal grain size of the entire piezoelectric transformer is uniformed, so that high performance and high reliability can be obtained, and a method of manufacturing the same.

In order to achieve the above object, according to the first major aspect of the present invention, there is provided a stacked piezoelectric transformer formed by stacking a plurality of piezoelectric ceramic sheets each formed with internal electrodes at predetermined regions thereof, and having portions formed with the internal electrodes as input portions, and a portion not formed with the internal electrodes as an output portion, wherein ceramic layers, which are formed by mixing a small amount of metal powder to a ceramic powder made of the same material as that of the piezoelectric ceramic sheets, are formed among layers of the output portion.

In connection to the first major aspect described above, the present invention has subsidiary aspects as follows.

Each of the ceramic layers formed among the layers of the output portion has the same thickness as that of each of the internal electrodes.

The metal powder mixed in the ceramic powder is one of silver, palladium, and a mixture of silver and palladium, and its mixing ratio falls within the range from 0.1 wt % (inclusive) to 3 wt % (inclusive) with respect to the ceramic powder.

In order to achieve the above object, according to the second major aspect of the present invention, there is provided a method of manufacturing a stacked piezoelectric transformer, comprising the steps of forming an internal electrode at a predetermined region of a piezoelectric ceramic sheet, forming, at a remaining region of the piezoelectric ceramic sheet, a ceramic material obtained by mixing a small amount of metal powder to a ceramic powder made of the same material as that of the piezoelectric ceramic sheet to have the same thickness as that of the internal electrode, and stacking a plurality of piezoelectric ceramic sheets each obtained in this manner.

According to the present invention, ceramic paste mixed with a metal powder such as silver or palladium is applied to that region (mainly the output portion) on the piezoelectric ceramic sheet, which forms the stacked piezoelectric transformer, excluding the internal electrode. Due to the sintering reaction promoting effect of the ceramic material imparted by the metal powder such as silver or palladium, sintering can be performed while adjusting the crystal grain size of the ceramic material at the input portions of the piezoelectric transformer where the internal electrodes are present and that at the output portion where no internal electrodes are present, to become substantially the same. As a result, the crystal grain size of the ceramic material of the entire piezoelectric transformer can be uniformly adjusted, and a stacked piezoelectric transformer having high electrical and mechanical performance and good reliability can be obtained.

The above and many other objects, features and advantages of the present invention will become manifest to those skilled in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Several preferred embodiments of the present invention will be described with reference to the accompanying drawings.

Figure 1A:
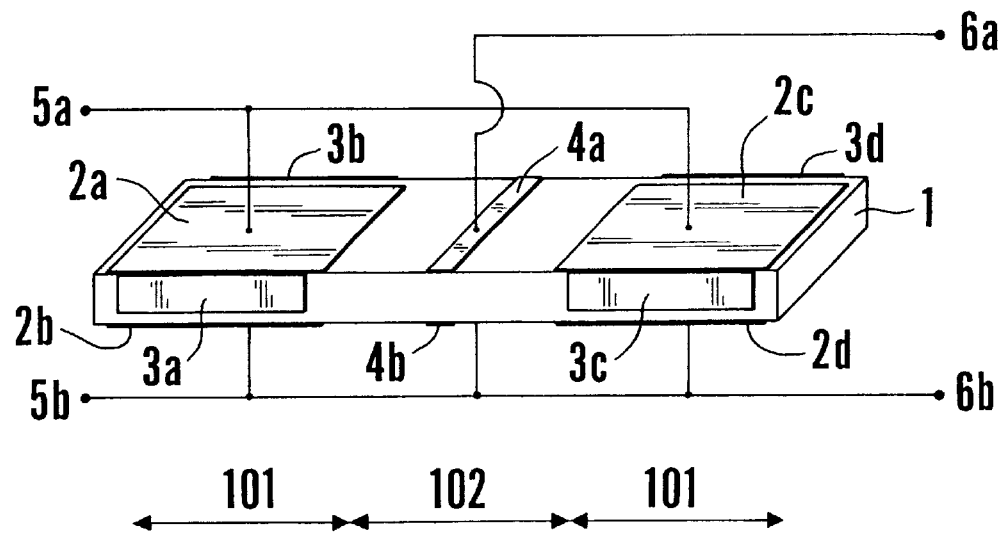
FIG. 1A is a schematic perspective view showing an example of a conventional symmetric Rosen tertiary stacked piezoelectric transformer.
Figure 1B:
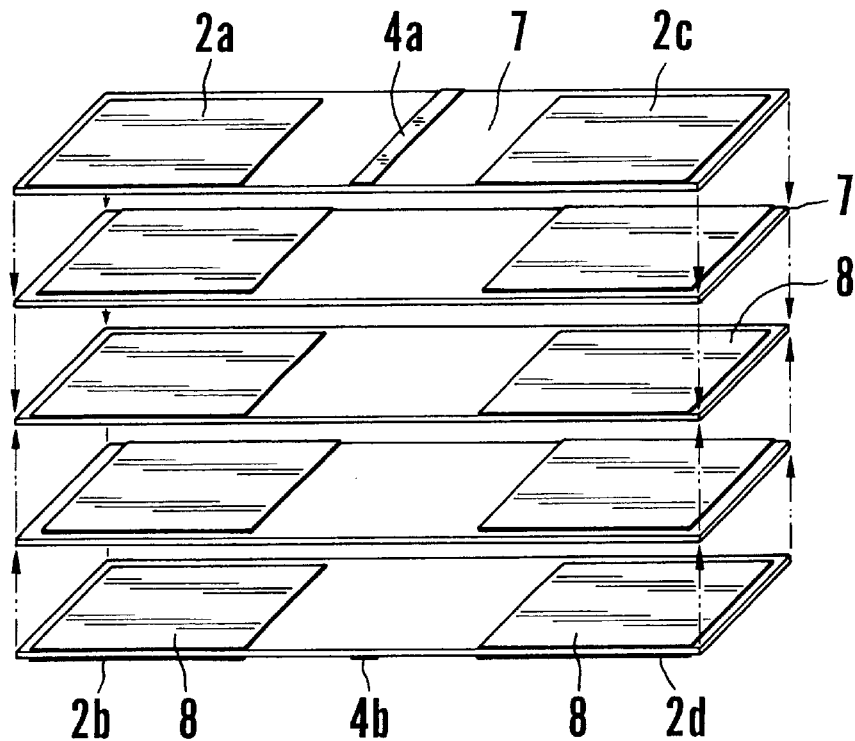
FIG. 1B is an exploded perspective view of the same.
Figure 2A:
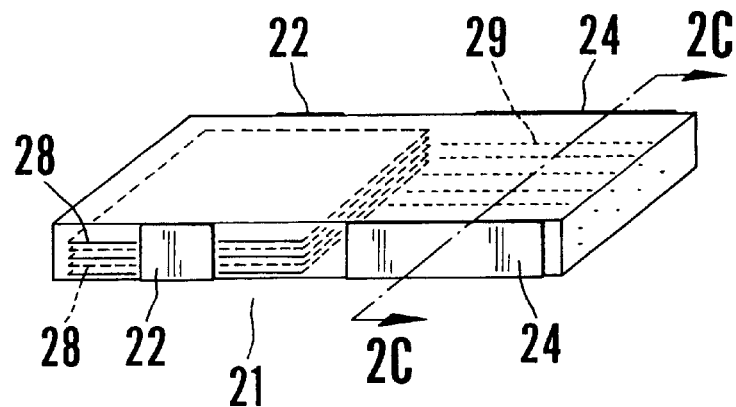
FIG. 2A is a schematic perspective view showing another example of a conventional stacked piezoelectric transformer.
Figure 2B:
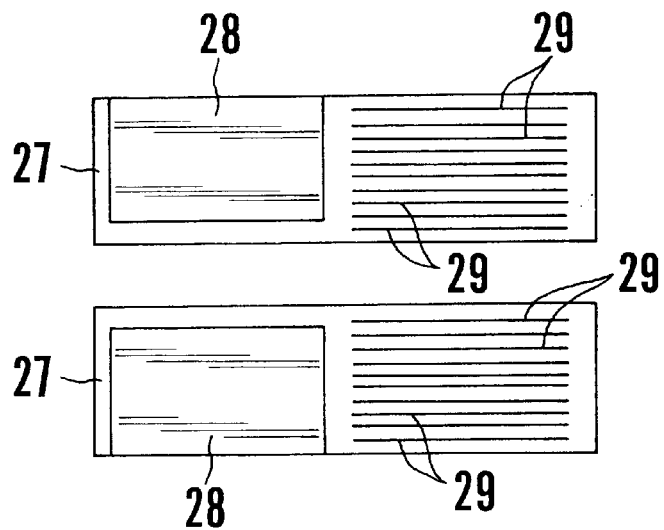
FIG. 2B is a plan view showing a set of green sheets printed with a counter internal electrode pattern and a dotted floating internal electrode pattern.
Figure 2C:
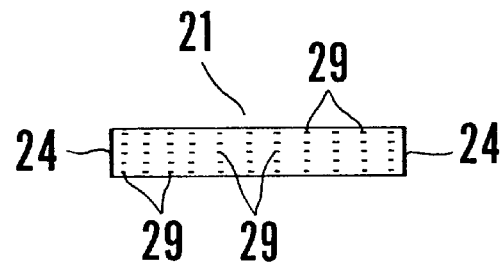
FIG. 2C is a sectional view taken along the line 2C—2C of FIG. 2A.
Figure 3:
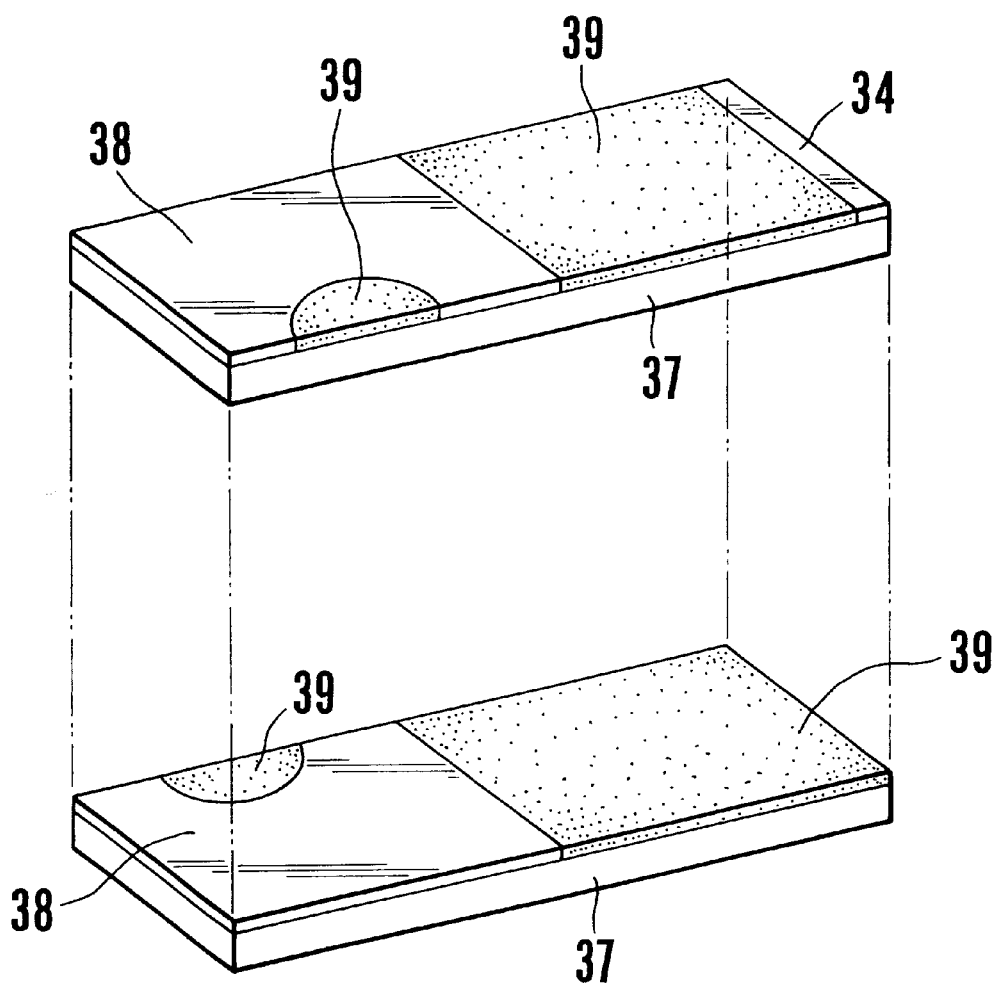
FIG. 3 is a schematic perspective view showing still another example of the conventional stacked piezoelectric transformer.
Figure 4A:
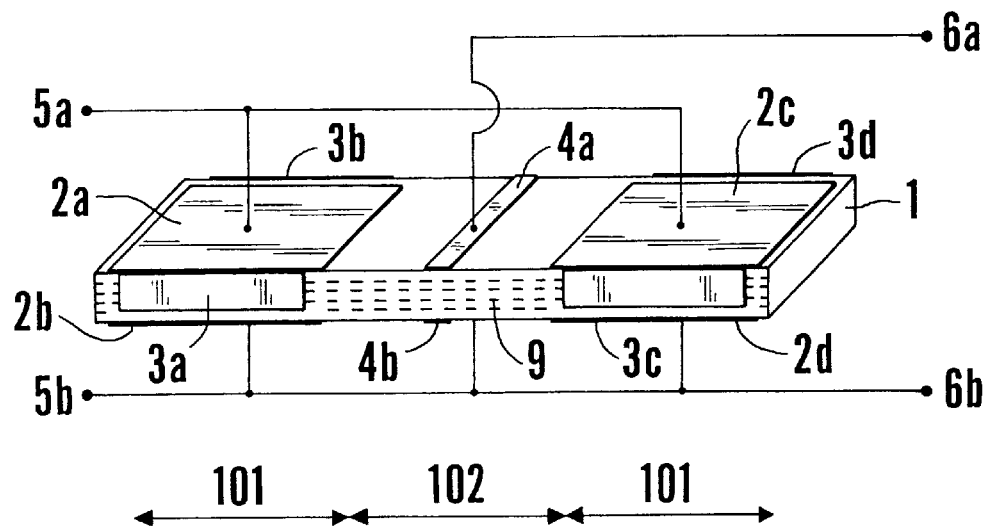
FIG. 4A is a schematic perspective view showing a symmetric Rosen tertiary stacked piezoelectric transformer according to an embodiment of the present invention.
Figure 4B:
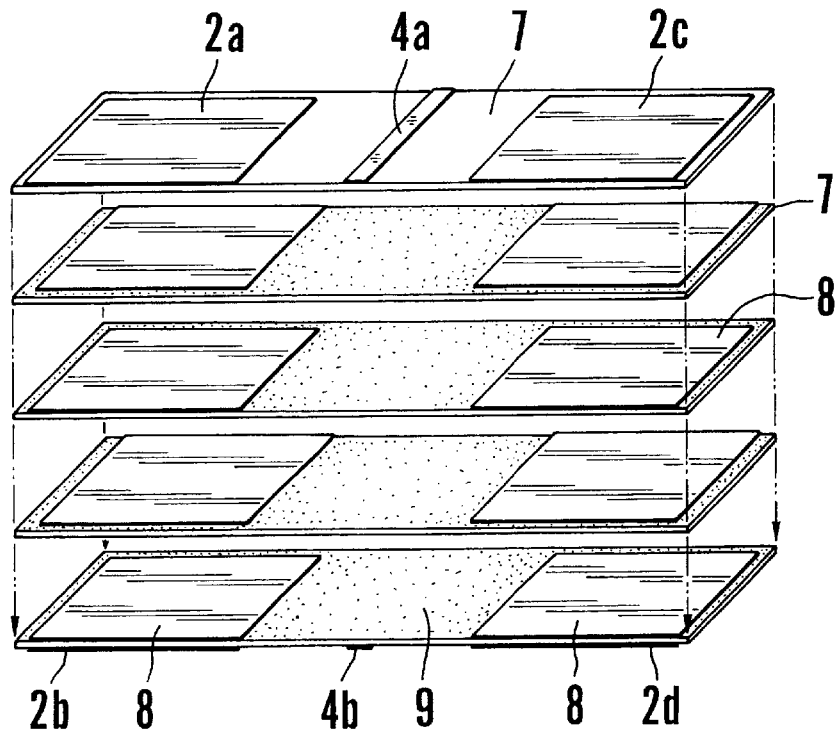
FIG. 4B is an exploded perspective view of the same.

FIGS. 4A and 4B show a symmetric Rosen tertiary stacked transformer element according to the first embodiment of the present invention, in which FIG. 4A is a perspective view showing the symmetric Rosen tertiary stacked transformer element according to the first embodiment of the present invention, and FIG. 4B is an exploded perspective view showing the same.

The symmetric Rosen tertiary stacked transformer element according to the first embodiment of the present invention shown in FIGS. 4A and 4B is a stacked piezoelectric transformer formed by stacking a plurality of piezoelectric ceramic sheets 7 formed with internal electrodes 8 at their predetermined regions. Regions where the internal electrodes 8 are formed serve as input portions 101, and a region where no internal electrodes 8 are formed serves as an output portion 102. Ceramic layers (ceramic paste portions) 9, formed by mixing a small amount of metal powder in a ceramic powder made of the same material as that of the piezoelectric ceramic sheets 7, are formed among the layers of the output portion 102 to each have the same thickness as that of the internal electrode S.

The metal powder is silver or palladium, or their mixture. The proportion of the contained metal powder is set to fall within the range from 0.1 wt % (inclusive) to 3 wt % (inclusive) with respect to the ceramic powder.

The stacked piezoelectric ceramic sheets 7 are integrated by pressing and sintered to obtain a piezoelectric element 1. Thereafter, input electrodes 2a, 2b, 2c, and 2d, side electrodes 3a, 3b, 3c, and 3d for connecting the internal electrodes 8 to the input electrodes 2a, 2b, 2c, and 2d, and output electrodes 4a and 4b are formed, thus completing a stacked piezoelectric transformer.

The input portions 101 at those regions of the piezoelectric element 1 where the internal electrodes 8 are formed are polarized in the direction of thickness of the piezoelectric element 1, and the output portion 102 at that region of the piezoelectric element 1 where no internal electrodes 8 are formed is polarized in the direction of length of the piezoelectric element 1.

The operation of the symmetric Rosen tertiary stacked piezoelectric transformer element according to the first embodiment of the present invention shown in FIGS. 4A and 4B is as follows. When a voltage is applied from external terminals 5a and 5b to the input electrodes 2a, 2b, 2c, and 2d of the input portions 101, an electric field is applied to the input portions 101 in the direction of polarization. Longitudinal vibration in the direction of length is excited by the inverse piezoelectric effect in which the element is displaced in a direction perpendicular to the direction of polarization, and the entire piezoelectric element vibrates.

In the output portion 102, mechanical strain occurs in the direction of polarization. Then, due to the piezoelectric positive effect in which a potential difference occurs in the direction of polarization, an output voltage having the same frequency as that of the input voltage is output from the output electrodes 4a and 4b to external terminals 6a and 6b.

A method of manufacturing the symmetric Rosen tertiary stacked piezoelectric transformer according to one embodiment of the present invention shown in FIGS. 4A and 4b will be described.

As the piezoelectric ceramic sheets 7, those obtained by mixing and dispersing a PZT ($PbZrO_3$—$PbTiO_3$)-based ceramic material, a binder, a solvent, and a plasticizer to prepare a slurry, and thereafter forming the slurry into sheets by a doctor blade are used. As the material of the ceramic paste portions 9, one obtained by adding silver powder to a PZT-based ceramic powder having the same component as that of the piezoelectric ceramic sheets 7, adding a binder and a solvent to the silver powder-added ceramic powder, and adjusting the viscosity of the resultant mixture to prepare a paste is used. As the binder, ethyl cellulose is used. As the solvent, butyl Carbitol acetate, or the like is used.

First, the internal electrodes 8 made of a silver-palladium alloy are formed on the two ends of each piezoelectric ceramic sheet 7 by screen printing. By using the ceramic paste added with silver powder, the ceramic paste portion is formed by screen printing at a portion excluding the output portion and the internal electrodes 8. The ceramic paste portion 9 is formed by coating to have the same thickness as that of the internal electrode 8.

A plurality of piezoelectric ceramic sheets 7 formed with internal electrodes and each obtained in the above manner are stacked and are thereafter heat-pressed. The pressed body is sintered at 1,100° C. The input electrodes 2a, 2b, 2c, and 2d, the side electrodes 3a, 3b, 3c, and 3d, and the output electrodes 4a and 4b are formed by using silver paste, to obtain a stacked piezoelectric transformer having a length of 42 mm, a width of 5 mm, and a total thickness of 1 mm.

A voltage of 1.5 kV/mm is applied to the input and output portions of the obtained stacked piezoelectric transformer in an insulating oil at 170° C. to perform polarization.

Table 1 shows results obtained by examining the crystal grain size of the ceramic material, the mechanical strength obtained through 3-point bending, and electrical characteristics while changing the amounts of silver added to the ceramic paste.

TABLE 1

| Amounts of silver (wt %) | grain size ($\mu$m) of ceramic material of input portions | grain size ($\mu$m) of ceramic material of output portion | mechanical strength (kgf/mm$^2$) | output-side electro-mechanical coupling coefficient k (%) | Remarks |
|---|---|---|---|---|---|
| 0 | 2.4 | 1.2 | 8.3 | 28 | comparative example (prior art) |
| 0.1 | 2.4 | 1.5 | 8.9 | 30 | present invention |
| 1 | 2.4 | 1.8 | 10.2 | 33 | present invention |
| 3 | 2.4 | 2.2 | 13.5 | 35 | present invention |
| 4 | 2.4 | 2.4 | 9.5 | 33 | comparative example |

As is apparent from Table 1, in the stacked piezoelectric transformer according to the present invention, as the ceramic paste added with silver to promote sintering of the ceramic material is applied to the output portion by printing, the growth of the crystal grain of the ceramic material of the output portion is promoted during sintering. As compared to the conventional piezoelectric transformer, the mechanical strength and the electrical characteristics, e.g., the electro-mechanical coupling coefficient, can be improved. When the amounts of silver added to the ceramic paste are 4 wt %, which exceeds 3 wt %, voids are start to form in the output portion due to sintering of silver, to decrease the mechanical strength. Therefore, the amounts of silver are preferably equal to or less than 3 wt %.

The second embodiment of the present invention will be described. In the second embodiment, in the same manner as in the first embodiment, a PZT-based ceramic material is used as the material of the piezoelectric ceramic sheets, and a silver-palladium alloy is used as the material of the internal electrodes. As a metal to be added to the ceramic paste in order to promote sintering of the ceramic material, a powder mixture of silver (70 wt %) and palladium (30 wt %) is used. A stacked piezoelectric transformer having a length of 42 mm, a width of 5 mm, and a total thickness of 1 mm is fabricated in the same manner as in the first embodiment.

A voltage of 1.5 kV/mm is applied to the input and output portions of the obtained stacked piezoelectric transformer in an insulating oil at 170° C. to perform polarization.

Table 2 shows results obtained by examining the crystal grain size of the ceramic material, the mechanical strength obtained through 3-point bending, and electrical characteristics while varying the amounts of the silver-palladium powder mixture added to the ceramic paste.

TABLE 2

| Amounts of silver and palladium (wt %) | grain size ($\mu$m) of ceramic material of input portions | grain size ($\mu$m) of ceramic material of output portion | mechanical strength (kgf/mm$^2$) | output-side electro-mechanical coupling coefficient k (%) | Remarks |
|---|---|---|---|---|---|
| 0 | 2.4 | 1.2 | 8.3 | 28 | comparative example (prior art) |
| 0.1 | 2.4 | 1.4 | 8.8 | 30 | present invention |
| 1 | 2.4 | 1.8 | 9.7 | 33 | present invention |
| 3 | 2.4 | 2.1 | 13.7 | 35 | present invention |
| 4 | 2.4 | 2.3 | 9.3 | 33 | comparative example |

As is apparent from Table 2, in the stacked piezoelectric transformer according to the present invention, as the ceramic paste, to which the silver-palladium powder mixture is added in amounts from 0.1 wt % (inclusive) to 3 wt % (inclusive) in order to promote sintering of the ceramic material, is applied to the output portion by printing, the growth of the crystal grain of the ceramic material of the output portion is promoted during sintering. As compared to the conventional piezoelectric transformer, the mechanical strength and the electrical characteristics, e.g., the coupling coefficient, can be improved.

What is claimed is:

1. A stacked piezoelectric transformer formed by stacking a plurality of piezoelectric ceramic sheets each formed with internal electrodes at predetermined regions thereof, and having portions formed with said internal electrodes as input portions, and a portion not formed with said internal electrodes as an output portion, wherein ceramic layers, which are formed by mixing a small amount of metal powder to a ceramic powder made of the same material as that of said piezoelectric ceramic sheets, are formed among layers of said output portion.

2. A stacked piezoelectric transformer according to claim 1, wherein each of said ceramic layers formed among said layers of said output portion has the same thickness as that of each of said internal electrodes.

3. A stacked piezoelectric transformer according to claim 1, wherein said metal powder mixed in said ceramic powder is one member selected from the group consisting of silver, palladium, and a mixture of silver and palladium.

4. A stacked piezoelectric transformer according to claim 1, wherein said metal powder is mixed in a mixing ratio falling within the range from 0.1 wt % (inclusive) to 3 wt % (inclusive) with respect to said ceramic powder.

* * * * *